United States Patent [19]
Hargrove et al.

[11] Patent Number: 5,731,941
[45] Date of Patent: Mar. 24, 1998

[54] ELECTROSTATIC DISCHARGE SUPPRESSION CIRCUIT EMPLOYING TRENCH CAPACITOR

[75] Inventors: Michael John Hargrove, Clinton Corners, N.Y.; Steven Howard Voldman, Burlington, Vt.

[73] Assignee: International Business Machines Corporation, Armonk, N.Y.

[21] Appl. No.: 525,110

[22] Filed: Sep. 8, 1995

[51] Int. Cl.⁶ .................................................. H02H 9/00
[52] U.S. Cl. .............................. 361/56; 361/111; 361/118
[58] Field of Search ................................ 361/18, 56, 91, 361/111, 118, 127, 115

[56] References Cited

U.S. PATENT DOCUMENTS

| | | | |
|---|---|---|---|
| 4,100,561 | 7/1978 | Ollendorf | 357/13 |
| 4,688,063 | 8/1987 | Lu et al. | 357/23.6 |
| 4,801,988 | 1/1989 | Kenney | 357/23.6 |
| 4,989,057 | 1/1991 | Lu | 357/23.7 |
| 5,130,770 | 7/1992 | Blanc et al. | 357/23.7 |
| 5,250,829 | 10/1993 | Bronner et al. | 257/301 |
| 5,264,716 | 11/1993 | Kenney | 257/301 |
| 5,287,241 | 2/1994 | Puar | 361/56 |
| 5,290,724 | 3/1994 | Leach | 437/51 |
| 5,384,474 | 1/1995 | Park et al. | 257/304 |
| 5,406,111 | 4/1995 | Sun | 257/497 |
| 5,514,612 | 5/1996 | Rao et al. | 437/51 |

OTHER PUBLICATIONS

Geissler, et al. "Cascaded Electrostatic Discharge Protection Structure", IBM Tech. Disclosure Bulletin, vol. 30, No. 8, pp. 389–390, Jan. 1988.

Colt, J. Z. "Chip Encircling Electrostatic Discharge Protection", IBM Tech. Disclosure Bulletin, vol. 33, No. 9, pp. 5–6, Feb. 1991.

*Primary Examiner*—Jeffrey A. Gaffin
*Assistant Examiner*—Stephen Jackson
*Attorney, Agent, or Firm*—Heslin & Rothenberg, P.C.

[57] ABSTRACT

An enhanced electrostatic discharge suppression circuit is disclosed for protecting integrated circuit chips from electrostatic discharges or other potentially damaging voltage transients on an input/output pad. The suppression circuit includes a discharge circuit, electrically coupled to the input/output pad, having a diode comprising a diffusion in a substrate well formed in a substrate. The diffusion is connected to the input/output pad of the integrated circuit. A capacitor is locally provided to couple the substrate well to the substrate. The capacitor is sized to maintain the diode in a forward-bias mode during the electrostatic discharge event, thereby facilitating dissipating of the electrostatic discharge. The capacitor comprises a trench capacitor, which depending upon the configuration, may function as a guard ring for the discharge circuit. Certain beneficial parasitic effects are also discussed in association with integration of a trench capacitor into the suppression circuit.

21 Claims, 4 Drawing Sheets

ELECTROSTATIC DISCHARGE SUPPRESSION CIRCUIT EMPLOYING TRENCH CAPACITOR

TECHNICAL FIELD

This invention relates in general to protection of integrated circuit chips, and more particularly, to an enhanced dual diode suppression circuit for protecting integrated circuit chips from electrostatic discharges or other potentially damaging voltage transients occurring prior to mounting thereof onto a circuit card.

BACKGROUND ART

Electrostatic discharge (ESD) is a phenomenon known to degrade or destroy electronic components. In particular, given the decreasing size of circuit features with ever improving process technology, static electricity can destroy or substantially harm many of today's integrated circuits. Electrostatic discharge can occur, for example, from human handling, automated circuit testing or as a packaged circuit slides on its pins across another surface. The circuits most susceptible to damage are unpackaged or packaged finished circuits which have not yet been installed into a finished product. Once installed, for example, onto a circuit card, other means exist to protect the circuits from damage.

Various techniques have been employed to protect integrated circuit chips handled by humans during the fabrication process. These methods include special handling procedures, use of grounding equipment and the addition of protective components to the chip circuitry. The most popular technique used to protect complementary metal-oxide semiconductor (CMOS) circuits from an ESD event is the addition of diffused or implanted dual clamping diodes to clamp input and output voltages to within the boundaries of the chip's power supply connections. Such dual diodes are coupled between the input/output pads of the circuit and the pins to which the power supplies are connected. With an electrostatic discharge event of one polarity, a first diode is forward biased and with a discharge event of the opposite polarity, the second diode is forward biased. Other methods used for protecting CMOS circuits from electrostatic discharge damage are typically variations on this dual diode clamping approach.

Due to the importance of ESD protection, significant effort continues in the chip fabrication and testing technology to improve known ESD protection circuits. The present invention is a result of this effort.

DISCLOSURE OF INVENTION

Briefly summarized, the invention comprises in one aspect a suppression circuit for dissipating an electrostatic discharge event at an input/output (I/O) node of an integrated circuit. The suppression circuit includes a discharge circuit electrically coupled to the input/output node for dissipating the electrostatic discharge. The discharge circuit includes a diode comprising a diffusion in a substrate well formed in a substrate. The diffusion is connected to the input/output node of the integrated circuit. A capacitor locally couples the substrate well to the substrate such that the diode is maintained in a forward biased mode during the electrostatic discharge event, thereby facilitating dissipating of the electrostatic discharge.

As an enhancement, the capacitor can encircle the diffusion and function as a guard ring therefore, as well as for other components of the discharge circuit. In implementation, the diffusion, substrate well and substrate form a vertical bipolar device, and the capacitor induces a base current in this bipolar device upon occurrence of the electrostatic discharge event, thereby enhancing turn-on characteristics of the device to facilitate dissipating the electrostatic discharge. If conventional memory cell type storage capacitors are employed, then multiple such capacitors are used to couple the substrate well to the substrate.

In another aspect, a suppression circuit is provided for dissipating an electrostatic discharge event at an input/output node of an integrated circuit. The suppression circuit includes a discharge circuit electrically coupled to the input/output node. The discharge circuit includes a diode for dissipating the electrostatic discharge event. The diode comprises an interface of a first type semiconductor material within a second type semiconductor material. The diode is coupled such that the first type semiconductor material is electrically connected to the input/output node. A capacitor locally capacitively couples the second type semiconductor material to a substrate within which the diode is formed. The capacitor is sized to maintain the diode in a forward bias mode during the electrostatic discharge event, thereby facilitating dissipating of the electrostatic discharge.

In still another aspect, an integrated circuit chip is provided having an integrated circuit and multiple input/output pads coupled to the integrated circuit for external connection thereto. Multiple suppression circuits are electrically coupled to the multiple input/output pads. Each suppression circuit includes a discharge circuit that is electrically coupled to an associated input/output node for dissipating an electrostatic discharge event thereat. The discharge circuit includes a diode comprising a diffusion in a substrate well formed in a substrate. The diffusion is connected to the associated input/output node of the integrated circuit. A capacitor locally couples the substrate well to the chip substrate so that the diode is maintained in a forward bias mode during the electrostatic discharge event, thereby facilitating dissipating of the electrostatic discharge.

To restate, disclosed herein is an electrostatic discharge suppression circuit based on a dual diode approach and employing a trench capacitor to locally capacitively couple the N-well within which the discharge components are formed to chip substrate. By so locally capacitively coupling the N-well, significantly enhanced ESD suppression characteristics are obtained. For example, in addition to being able to suppress greater voltage levels (e.g., on the order of a 1000 volts improvement), enhanced response time is achieved by ensuring a fast turn-on of the PN diode and the vertical PNP bipolar transistor to dissipate a positive impulse on an associated I/O pad. This higher ESD suppression protection for the integrated circuit chip is achieved without increasing input capacitance at the input/output pads and without increasing layout area of the suppression circuits. Further, when employed in an integrated circuit chip having DRAM or DRAM/logic circuit components, no additional masks are required to implement the trench capacitors. For chips not employing DRAM circuitry, but using shallow trench isolation, few additional masks would be required to implement the trench concept disclosed. Finally, by configuring the trench capacitor in a ring structure, the capacitor can function as a guard ring for the entire discharge circuitry or selected components thereof.

BRIEF DESCRIPTION OF THE DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Figure 1:
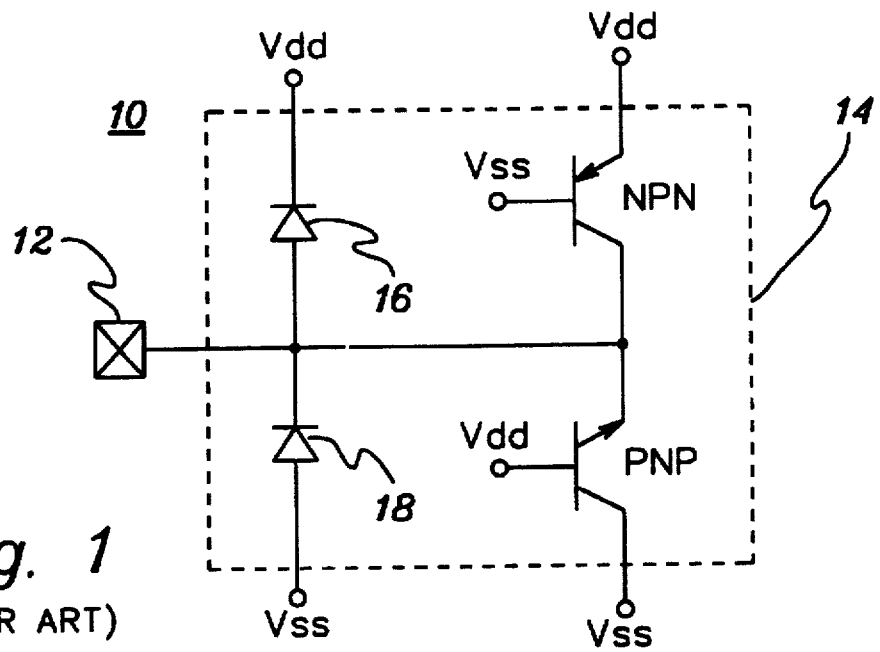
FIG. 1 is a schematic of a prior art dual diode ESD suppression circuit.
Figure 2:
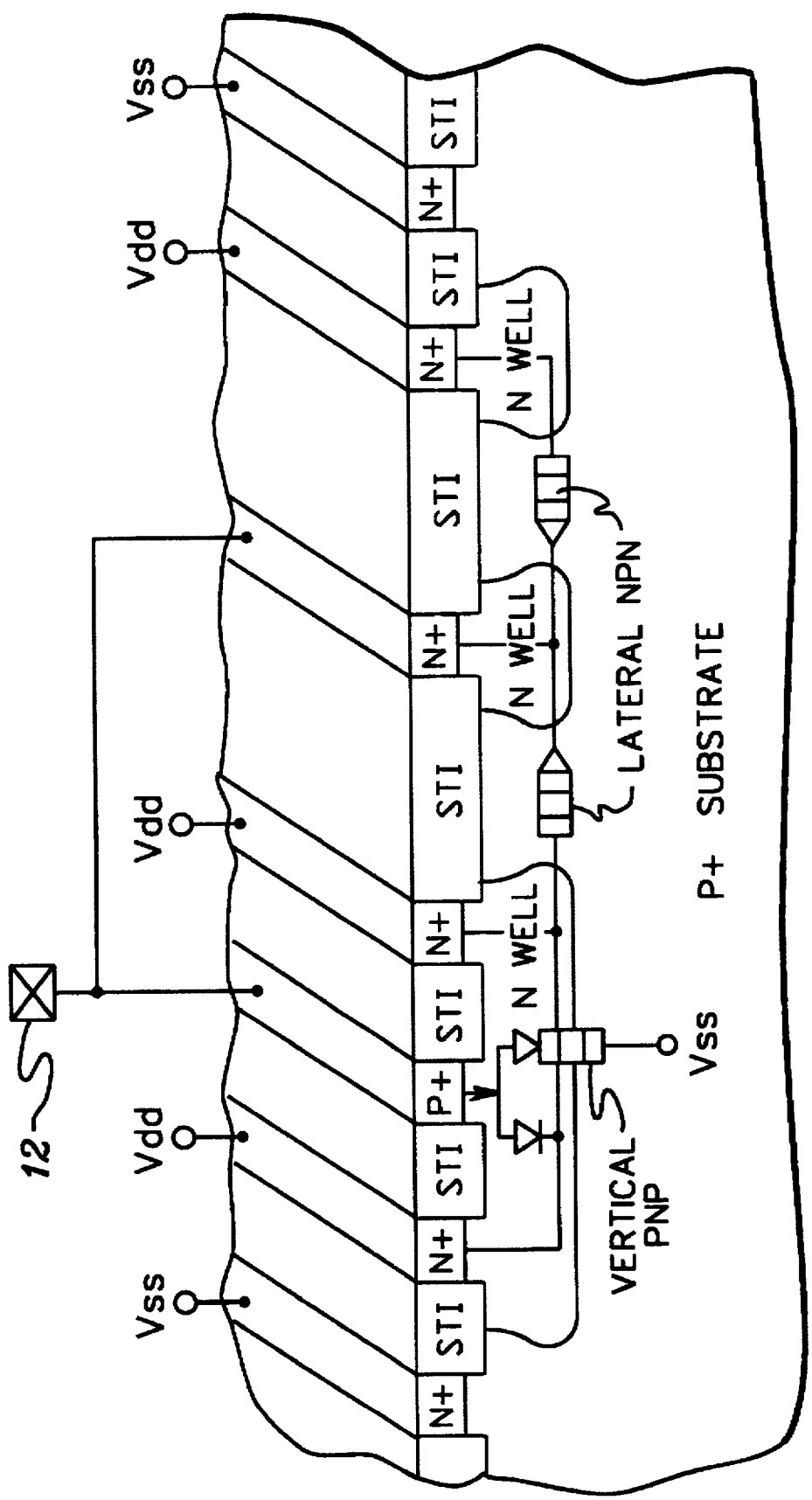
FIG. 2 is a cross-sectional view of a structural embodiment of the ESD suppression circuit of FIG. 1.

One embodiment of a conventional dual diode suppression circuit is schematically and structurally depicted in FIGS. 1 & 2, respectively. Beginning with FIG. 1, an integrated circuit chip, generally denoted 10, includes multiple input pads, output pads, or input and output pads (herein collectively referred to as input/output (I/O) pads), with only one I/O pad 12 being shown. A conventional dual diode suppression circuit 14, electrically connected to input/output pad 12, includes a first diode 16 electrically coupling pad 12 to a first power supply (Vdd) and a second diode 18 electrically connecting pad 12 to a second power supply (Vss). By way of example, diode 16 can comprise a P+ diode and diode 18 an N+ diode, while the Vdd power supply can comprise chip power supply and the Vss power supply ground potential.

Suppression circuit 14 also includes an NPN bipolar device and a PNP bipolar device. The NPN device is coupled between the Vdd power supply and pad 12, while the PNP device couples pad 12 and the Vss power supply. The NPN and PNP devices are gated by the Vss power supply and the Vdd power supply, respectively. The PNP bipolar device operates in conjunction with diode 16 to discharge an electrostatic discharge (ESD) event of positive polarity at pad 12, while the NPN bipolar device operates in association with diode 18 to dissipate an ESD event of negative polarity at pad 12.

FIG. 2 depicts one structural embodiment of suppression circuit 14. In this embodiment, diode 16 (FIG. 1) comprises a PN diode formed by the P+ diffusion in the leftmost N-well, while the PNP bipolar device comprises a vertical bipolar structure defined by the P+ diffusion, leftmost N-well, and P+ substrate. The NPN diode 18 (FIG. 1) is defined by the interface of the leftmost N-well and the P+ substrate, and the NPN bipolar device comprises a lateral bipolar device formed (as shown) by the leftmost N-well, the P+ substrate, and the middle N-well. A second, supplemental lateral NPN device is also defined by the rightmost N-well, the P+ substrate, and the middle N-well. As shown, the P+ substrate is electrically connected via N+diffusions to the Vss power supply, while the rightmost and leftmost N-wells are connected to the Vdd power supply. The middle N-well electrically connects to pad 12, as does the P+ diffusion in the leftmost N-well. Isolation is of the type referred to as shallow trench isolation (STI) which is well known in the literature.

There are four conventional modes of testing the suppression circuit of FIGS. 1 & 2 relative to the Vdd and Vss power supplies. These test modes are:

I. Ground Vss power supply and place a positive impulse on the I/O pad;

II. Ground Vdd power supply, and place a positive impulse on the I/O pad;

III. Ground Vss power supply, and impulse the I/O pad negative; and

IV. Ground Vdd power supply, while impulsing the I/O pad negative.

In the positive impulse test modes (i.e., modes I & II) the PN diode and the PNP bipolar device cooperate to dissipate the charge. That is, the PN diode allows current to flow through the Vdd power grid and through the net capacitance of the chip back to the Vss ground plane, while current is discharging through the PNP bipolar device to the substrate in parallel with discharging of the impulse through the diode. Which device carries the greater load is dependent upon the process technology employed. In retrograde well technology, the majority of the current passes through the PN diode.

In test mode III, i.e., a negative impulse on the pad with Vss grounded, current will flow back to the pad through the NP diode from the grounded substrate until the pulse is dissipated. In test mode IV, the NPN bipolar devices discharge the impulse to he Vdd power supply grid, which depending upon the couplings, may be working in parallel with the NP diode. By grounding the Vdd power supply, the NPN bipolar devices are forward biased active to carry the load in discharging a negative impulse on the pad.

Suppression circuit 14 discussed herein with respect to FIGS. 1 & 2 can be satisfactorily employed depending upon the technology. However, as fabrication technology continues to shrink the structural elements employed in integrated circuits, an operational problem with the suppression circuit of FIGS. 1 & 2 has been identified. Specifically, if the N-well containing the P+ diffusion is shrunk too small, then the N-well node will have a tendency to couple capacitively upward upon application of a positive polarity ESD event to the pad. This is because the P+ diffusion will forward-bias injecting charge into the N-well, thereby causing the N-well to rise, which in turn forces the PN diode to start turning itself off. As a significant aspect, the present invention addresses this problem.

Generally stated, a concept of the present invention is to employ a capacitor structure to locally capacitively couple this N-well to chip substrate. By making the capacitor structure of sufficiently high capacitance, the N-well potential can be held down to allow better discharge of the ESD event through the PN diode. Disposition of the capacitor structure adjacent to the PN diode has been experimentally shown to make a significant difference in operation of the suppression circuit. As described further below, the capacitor structure is preferably implemented as a deep trench capacitor, which may either penetrate through the N-well containing the PN diode or an encircling outer N-well tub. Both of these implementations are described below with reference to FIGS. 4 & 5.

Figure 3:
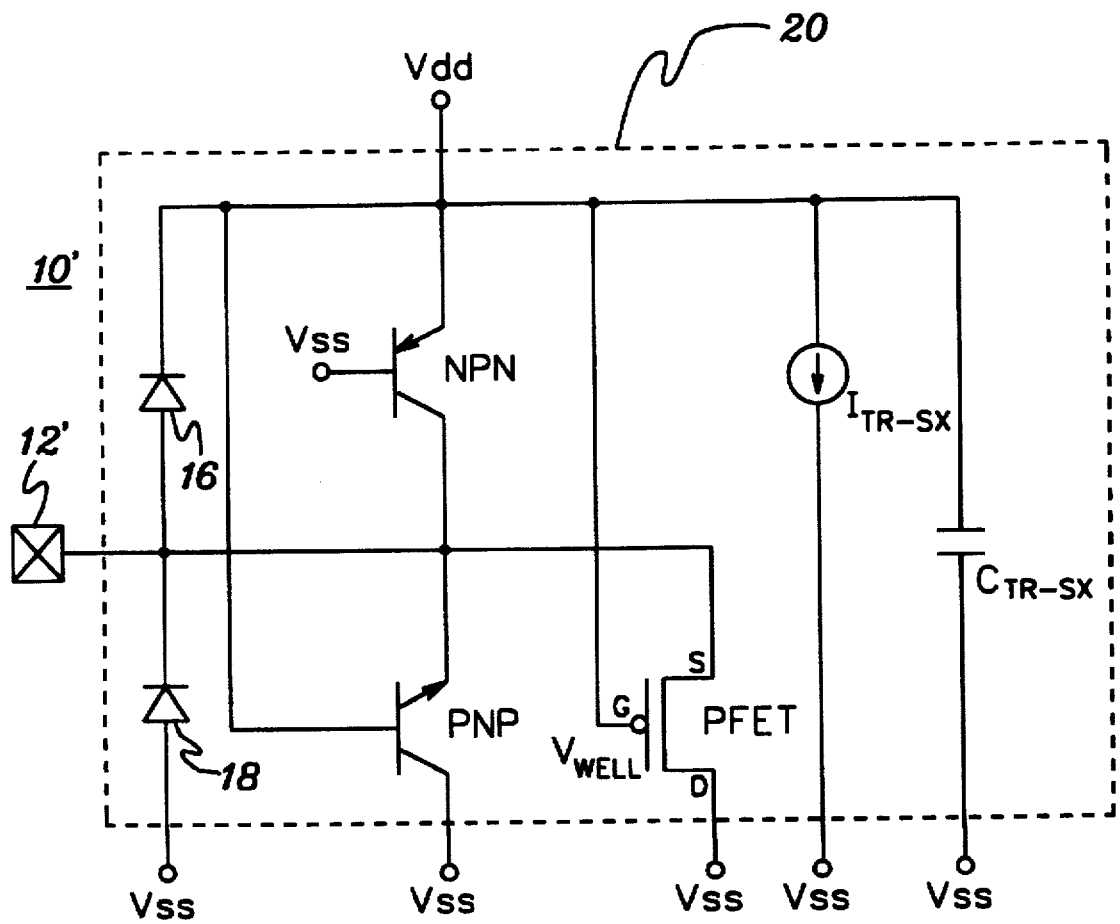
FIG. 3 is a schematic of an ESD suppression circuit in accordance with the present invention.

FIG. 3 depicts schematically one embodiment of a suppression circuit, generally denoted 20, in accordance with the present invention. Circuit 20 is shown connected to an input/output pad 12' of multiple input/output pads on an integrated circuit chip 10'. Suppression circuit 20 comprises a modified dual diode circuit containing a PN diode 16 electrically connected between pad 12' and a Vdd power supply and an NP diode 18 electrically connected between pad 12' and a Vss ground supply. Circuit 20 further includes a PNP transistor gated by the Vdd power supply and coupled between pad 12' and the Vss ground supply, along with an NPN transistor gated by the Vss ground supply and coupled between the input/output pad 12' and the Vdd power supply.

As mentioned, a trench-to-substrate (TR-SX) capacitor $C_{TR-SX}$ is electrically connected between the Vdd power supply and the Vss ground supply. A principal function of this trench capacitor is to maintain forward biasing of PN diode 16 during a positive polarity ESD event at the input/output node. This is preferably accomplished by locating the trench capacitor within the same N-well as the PN diode, and by appropriately sizing the trench capacitance. By way of example, a deep trench capacitor may be approximately 8–15 microns deep, with a trench dielectric of 100 Angstroms and a capacitance of 50–100 femtofarads.

Figure 4:
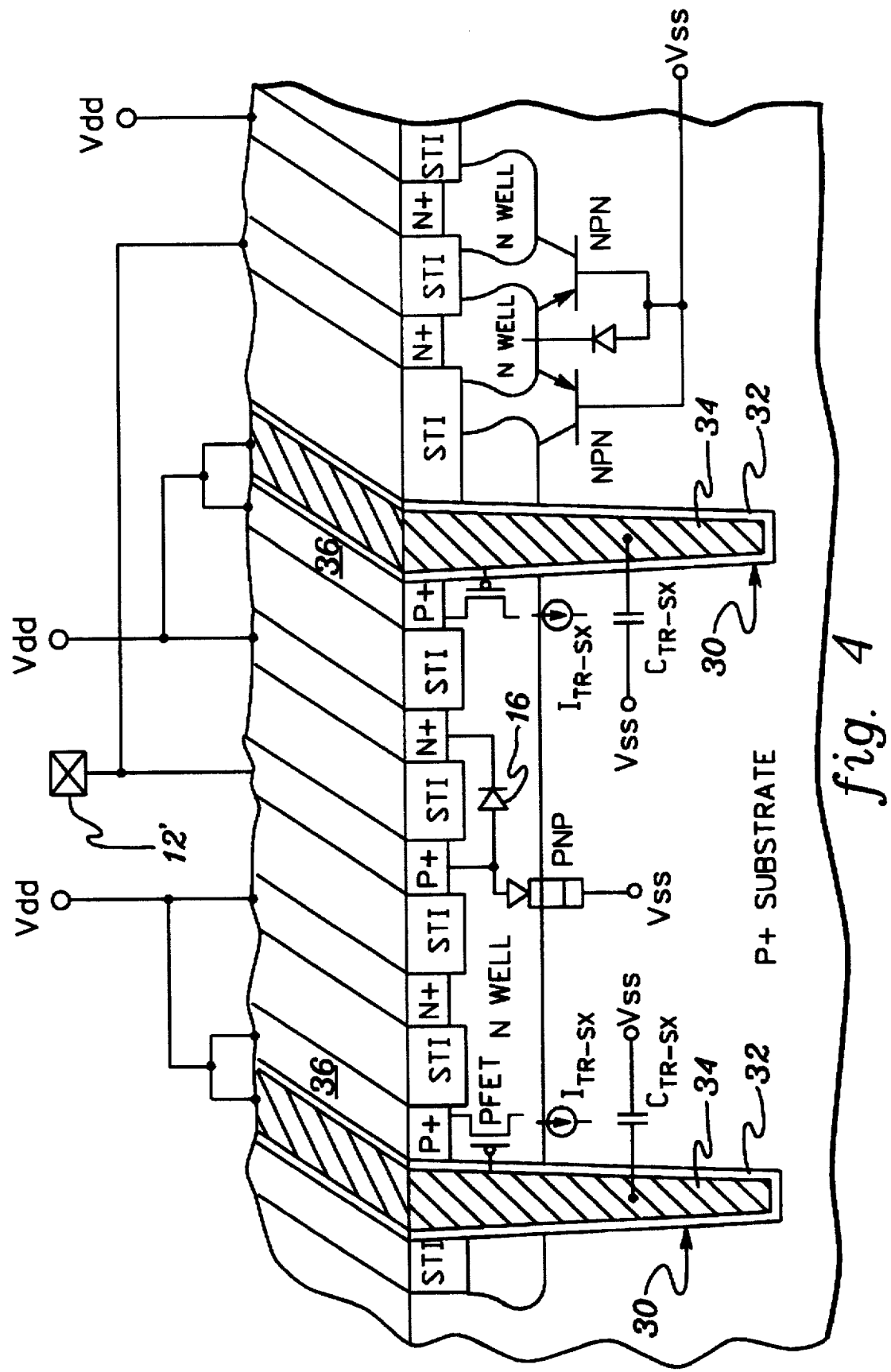
FIG. 4 is cross-sectional view of one structural embodiment of the ESD suppression circuit of FIG. 3 in accordance with the present invention.

As shown in FIG. 4, each trench capacitor 30 comprises a dielectric plate 32 such as an oxide-nitride dielectric, and a polysilicon electrode 34. By connecting trench capacitor 30 through an adjacent P+ diffusion 36 to the Vdd power supply and the P+ substrate to the Vss ground supply, a capacitor is established across dielectric 32. Because the trench capacitor is disposed adjacent to the PN diode and intersects the N-well within which the P+ diffusion resides, the capacitor operates to hold the N-well voltage low, i.e., at the substrate level (which is tied to the Vss ground plane). This in turn ensures that the PN diode 16 will remain on to dissipate the positive polarity ESD event on pad 12'. With forward biasing of the P+ well diode, the vertical PNP bipolar transistor element is also forward biased to facilitate dissipation of the event.

For testing mode I, i.e., a positive impulse with the P+ substrate grounded and the Vdd power supply floating, the trench capacitor couples the N-well structure to ground. This is achieved by the capacitive element being attached through wiring and diffusions to the well structure. The coupling of the well structure to a low potential allows for the P+ diffusion/N-well diode to forward bias upon receipt of a positive impulse at pad 12'. This facilitates initiation of forward-biasing of the PN diode and initiation of forward-biasing of the vertical PNP bipolar transistor element. In test mode II, with the substrate floating and the Vdd power supply grounded, the trench capacitor couples the N-well structure to ground and serves as a local capacitor to ground the local well structure. This again facilitates forward biasing of the P+ diffusion/N-well diode, thereby initiating both diode action and bipolar transistor action to dissipate a positive impulse at pad 12'.

The trench capacitor also acts as a current source, referred to in the figures as $I_{TR-SX}$, providing a leakage current between the N-well which it intersects and the substrate. When a positive potential is applied to the trench capacitance $C_{TR-SX}$, a depletion region is formed on the sidewall of the trench within the substrate, thereby inducing a leakage mechanism between the N-well and the substrate. This trench gate induced diode leakage mechanism acts as a source of electron base current for the vertical PNP transistor. When the Vdd power supply connection is either floated or grounded, and a well-to-substrate potential is established (i.e., a trench node-to-well voltage), an electron current will flow along the trench sidewall to the N-well structure. Thus, the trench capacitor acts as a virtual transistor current source where the electron source is the P+ substrate and the drain is the N-well structure. In addition to acting as base current for the vertical PNP bipolar transistor, this electron flow operates to lower the N-well potential, thereby causing additional feedback to increase the P+ diffusion/N-well diode performance. This leakage current can be significant because the chip substrate is assumed to comprise a heavily doped P+ substrate.

In addition to inducing leakage current, the trench capacitor with P+ diffusion (36) contact forms a parasitic P-channel field-effect transistor (PFET). This parasitic P-channel FET is active whenever the chip substrate is connected to Vss ground supply, and the P+ diffusion contact to the capacitor trench is ramped negatively. The vertical PFET has the P+ diffusion for the trench capacitor as its source, the P+ substrate as its drain, and the N-well as the body of the transistor, with the polysilicon electrode of the capacitor trench comprising the gate. This transistor is absent from the structure and circuit if the P+ diffusion (36) is not required to connect to the trench capacitor, i.e., the fabrication technology employed allows direct connect to the trench capacitor.

Different structural configurations for the trench capacitor may be employed and still provide the capacitive coupling function discussed hereinabove. For example, each trench capacitor could comprise a storage node type capacitor such as employed in a conventional dynamic random access memory (DRAM) cell (e.g., see commonly assigned U.S. Pat. Nos. 4,688,063; 4,801,988; 5,250,829; 5,264,716; and 5,384,474). If of a storage node configuration, then a plurality of trench capacitors, for example, 100–200, may be used in association with the discharge circuit components to ensure good capacitive coupling of the N-well to the substrate potential. Alternatively, the trench capacitor could be fabricated in the form of a ring structure wherein the two trench capacitors depicted in FIG. 4 would be opposing sides of a continuous oblong ring. By encircling the ESD discharge components in the intersected N-well, the trench capacitor efficiently functions as a guard ring structure for those components. This ring structure would isolate the discharge circuits from exterior chip regions from the suppression circuit. Such a guard ring would collect residual charge, as well as improve dynamic response of the ESD suppression circuit.

Figure 5:
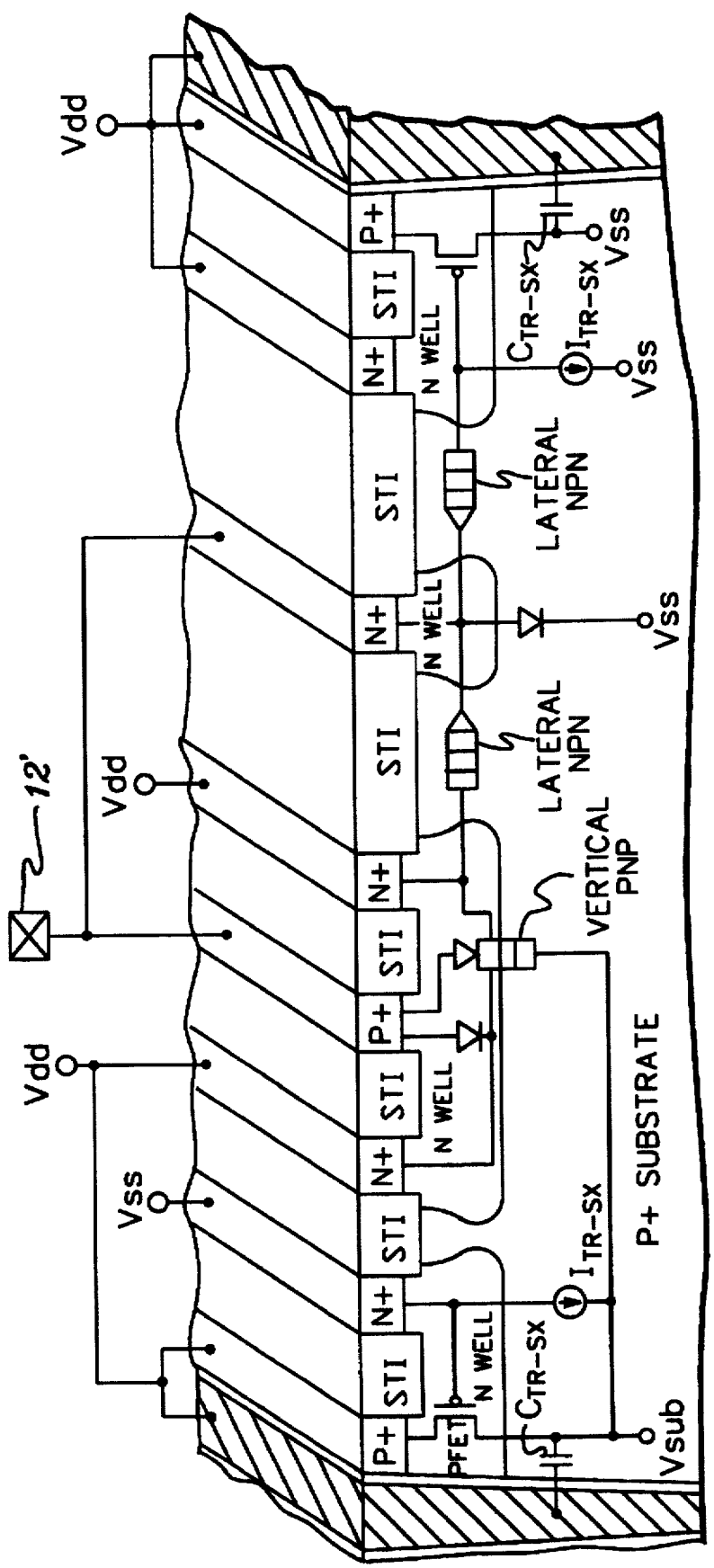
FIG. 5 is a cross-sectional view of another structural embodiment of the ESD suppression circuit of FIG. 3 in accordance with this invention.

FIG. 5 depicts another structural embodiment of a suppression circuit in accordance with the present invention. In this embodiment, the trench capacitor is assumed to comprise a continuous ring structure that intersects an outer N-well tub, which encircles an inner N-well tub (i.e., the two inner N-wells). With this configuration, the trench capacitor operates as a guard ring for the lateral NPN bipolar transistors and the NP diode, as well as for the PN diode and vertical PNP bipolar transistor. Further, the trench capacitor functions to locally capacitively couple both the outer and the inner N-well tubs to the chip substrate as discussed hereinabove.

Those skilled in the art will note from the above discussion that an electrostatic discharge suppression circuit is disclosed herein employing a trench capacitor to locally capacitively couple the N-well within which the discharge components reside to the substrate potential (typically Vss ground potential). By locally capacitively coupling the N-wells, significantly enhanced ESD suppression characteristics are obtained. For example, in addition to being able to suppress greater voltage levels, enhanced response time is achieved by ensuring a fast turn-on of the PN diode and the vertical PNP bipolar transistor to dissipate a positive impulse on an associated I/O pad. This higher ESD suppression protection for the integrated circuit chip is achieved without increasing input capacitance at the input/output pads and without increasing layout area of the suppression circuits. Further, when employed in an integrated circuit chip having DRAM or DRAM/logic circuit components, no additional masks are required to implement the deep trench capacitors. For chips not employing DRAM circuitry, but using shallow trench isolation (STI), no additional mask would again be required to implement the capacitive trench concept disclosed. By configuring the trench capacitor in a ring structure, the capacitor can function as guard ring for the entire discharge circuitry or selected components thereof, particularly the PN diode and the vertical PNP bipolar device employed in parallel to dissipate a positive impulse at a corresponding I/O pad.

While the invention has been described in detail herein in accordance with certain preferred embodiments thereof, many modifications and changes therein may be effected by those skilled in the art. For example, the novel capacitive coupling concept presented herein could be readily employed in other diode based ESD discharge circuits. Further, shallow trench isolation technology could alternatively be used to fabricate the desired trench capacitor(s). Accordingly, it is intended by the appended claims to cover all such modifications and changes as fall within the true spirit and scope of the invention.

We claim:

1. A suppression circuit for dissipating an electrostatic discharge event at an input/output node of an integrated circuit, said suppression circuit comprising:
    a discharge circuit electrically coupled to the input/output node for dissipating the electrostatic discharge event, said discharge circuit including a diode comprising a diffusion in a substrate well formed in a substrate, said diffusion being connected to said input/output node of the integrated circuit, wherein said substrate well is electrically connected to a Vdd power supply and said substrate is electrically connected to a Vss ground supply; and
    a capacitor locally coupling said substrate well to said substrate, said capacitor maintaining said diode in a forward-bias mode during the electrostatic discharge event, thereby facilitating dissipating of the electrostatic discharge.

2. The suppression circuit of claim 1, wherein said capacitor comprises a trench capacitor extending from an upper surface of said substrate well, through said substrate well and into said substrate.

3. The suppression circuit of claim 2, wherein said trench capacitor comprises a trench lined with a dielectric layer and filled with polysilicon.

4. The suppression circuit of claim 2, wherein said trench capacitor encircles said diffusion and functions as a guard ring for said diffusion in said substrate well.

5. A suppression circuit for dissipating an electrostatic discharge event at an input/output node of an integrated circuit, said suppression circuit comprising:
    a discharge circuit electrically coupled to the input/output node for dissipating the electrostatic discharge event, said discharge circuit including a diode comprising a diffusion in a substrate well formed in a substrate, said diffusion being connected to said input/output node of the integrated circuit;
    a capacitor locally coupling said substrate well to said substrate, said capacitor maintaining said diode in a forward-bias mode during the electrostatic discharge event, thereby facilitating dissipating of the electrostatic discharge; and
    wherein said diffusion, said substrate well and said substrate form a vertical bipolar device, and wherein said capacitor induces base current in said vertical bipolar device upon occurrence of said electrostatic discharge event, thereby enhancing turn-on of said vertical bipolar device with said electrostatic discharge event.

6. The suppression circuit of claim 5, wherein said diffusion comprises a P+ diffusion, said substrate well comprises an N-well, and said substrate comprises a P+ substrate such that said vertical bipolar device comprises a PNP bipolar transistor, said capacitor capacitively coupling said N-well to said P+ substrate.

7. A suppression circuit for dissipating an electrostatic discharge event at an input/output node of an integrated circuit, said suppression circuit comprising:
    a discharge circuit electrically coupled to the input/output node for dissipating the electrostatic discharge event, said discharge circuit including a diode comprising a diffusion in a substrate well formed in a substrate, said diffusion being connected to said input/output node of the integrated circuit;
    a capacitor locally coupling said substrate well to said substrate, said capacitor maintaining said diode in a forward-bias mode during the electrostatic discharge event, thereby facilitating dissipating of the electrostatic discharge; and
    wherein said substrate well comprises a first substrate well, and said discharge circuit further comprises a second substrate well formed within said substrate, wherein a lateral bipolar device is formed by said first substrate well, said substrate and said second substrate well, said lateral bipolar device facilitating dissipating of an electrostatic discharge event of a given polarity.

8. The suppression circuit of claim 7, wherein said capacitor comprises a trench capacitor extending from an upper surface of said first substrate well through said first substrate well into said substrate, said trench capacitor being configured to encircle said diffusion in said first substrate well.

9. A suppression circuit for dissipating an electrostatic discharge event at an input/output node of an integrated circuit, said suppression circuit comprising:
    a discharge circuit electrically coupled to the input/output node for dissipating the electrostatic discharge event, said discharge circuit including a diode comprising a diffusion in a substrate well formed in a substrate, said diffusion being connected to said input/output node of the integrated circuit;
    a capacitor locally coupling said substrate well to said substrate, said capacitor maintaining said diode in a forward-bias mode during the electrostatic discharge event, thereby facilitating dissipating of the electrostatic discharge; and
    wherein said substrate well comprises an inner substrate well, and said discharge circuit further comprises an outer substrate well formed in said substrate, said capacitor comprising a trench capacitor extending from an upper surface of said outer substrate well through said outer substrate well into said substrate, wherein said trench capacitor also functions as a guard ring for said diffusion in said inner substrate well.

10. A suppression circuit for dissipating an electrostatic discharge event at an input/output node of an integrated circuit, said suppression circuit comprising:
    a discharge circuit electrically coupled to the input/output node for dissipating the electrostatic discharge event, said discharge circuit including a diode comprising diffusion in a substrate well formed in a substrate, said diffusion being connected to said input/output node of the integrated circuit;
    a capacitor locally coupling said substrate well to said substrate, said capacitor maintaining said diode in a forward-bias mode during the electrostatic discharge event, thereby facilitating dissipating of the electrostatic discharge; and wherein said suppression circuit further comprises multiple storage node capacitors coupling said substrate well to said substrate, said capacitor comprising one storage node capacitor of said multiple storage node capacitors.

11. A suppression circuit for dissipating an electrostatic discharge event at an input/output node of an integrated circuit, said suppression circuit comprising:

a discharge circuit electrically coupled to the input/output node, said discharge circuit including a diode for dissipating the electrostatic discharge event, said diode comprising an interface of a first type semiconductor material within a second type semiconductor material, said diode being coupled such that said first type semiconductor material is electrically connected to said input/output node, wherein said second type semiconductor material is electrically coupled to a Vdd power supply and said substrate is electrically coupled to a Vss ground supply; and a capacitor capacitively coupling said second type semiconductor material to a substrate, said capacitor being sized to maintain said diode in a forward-bias mode during the electrostatic discharge event, thereby facilitating dissipating of the electrostatic discharge.

12. A suppression circuit for dissipating an electrostatic discharge event at an input/output node of an integrated circuit, said suppression circuit comprising:

a discharge circuit electrically coupled to the input/output node, said discharge circuit including a diode for dissipating the electrostatic discharge event, said diode comprising an in,or,ace of a first type semiconductor material within a second type semiconductor material, said diode being coupled such that said first type semiconductor material is electrically connected to said input/output node;

a capacitor capacitively coupling said second type semiconductor material to a substrate, said capacitor being sized to maintain said diode in a forward-bias mode during the electrostatic discharge event, thereby facilitating dissipating of the electrostatic discharge; and wherein said first type semiconductor material, said second type semiconductor material, and said substrate comprise a vertical bipolar device, and wherein said capacitor induces base current in said vertical bipolar device upon occurrence of said electrostatic discharge event, thereby enhancing turn-on of said vertical bipolar device.

13. A suppression circuit for dissipating an electrostatic discharge event at an input/output node of an integrated circuit, said suppression circuit comprising:

a discharge circuit electrically coupled to the input/output node, said discharge circuit including a diode for dissipating the electrostatic discharge event, said diode comprising an interface of a first type semiconductor material within a second type semiconductor material, said diode being coupled such that said first type semiconductor material is electrically connected to said input/output node;

a capacitor capacitively toppling said second type semiconductor material to a substrate, said capacitor being sized to maintain said diode in a forward-bias mode during the electrostatic discharge event, thereby facilitating dissipating of the electrostatic discharge; and wherein said capacitor at least partially encircles said discharge circuit and comprises a guard ring for said discharge circuit.

14. An integrated circuit chip comprising:

an integrated circuit;

multiple input/output pads coupled to the integrated circuit for external connection thereto; and multiple suppression circuits electrically coupled to said multiple input/output pads, each suppression circuit including a discharge circuit electrically coupled to an associated input/output node for dissipating an electrostatic input/output event thereat, said discharge circuit including a diode comprising a diffusion in a substrate well formed in a substrate, said diffusion being connected to said associated input/output node of the integrated circuit, wherein said substrate well is electrically connected to a Vdd Dower supply and said substrate is electrically connected to a Vss ground supply, and a capacitor locally coupling said substrate well to said substrate, said capacitor maintaining said diode in a forward bias mode during the electrostatic discharge event, thereby facilitating dissipating of the electrostatic discharge.

15. The integrated circuit chip of claim 14, wherein for each suppression circuit, the capacitor comprises a trench capacitor extending from an upper surface of the substrate well, through the substrate well and into the substrate.

16. The integrated circuit chip of claim 15, wherein within each suppression circuit, the trench capacitor encircles the diffusion and functions as a guard ring for the diffusion in the substrate well.

17. The integrated circuit chip of claim 16, wherein within each suppression circuit, the diffusion, the substrate well, and the substrate form a vertical bipolar device, and the trench capacitor induces base current in the vertical bipolar device upon occurrence of the electrostatic discharge event, thereby enhancing turn-on of the vertical bipolar device with the electrostatic discharge event.

18. A suppression circuit for dissipating an electrostatic discharge event at an input/output node of an integrated circuit, said suppression circuit comprising:

a discharge circuit electrically coupled to the input/output node for dissipating the electrostatic discharge event, said discharge circuit including a diode comprising a diffusion in a first well formed in a substrate, said diffusion being connected to said input/output node of the integrated circuit, wherein said first well is electrically connected to a Vdd power supply and said substrate is electrically connected to a Vss ground supply; and a capacitor coupling a second well to said substrate, said second well being electrically coupled to said first well such that said capacitor maintains said diode in a forward-biased mode during the electrostatic discharge event through a coupling of said first well to said substrate, thereby facilitating dissipating of the electrostatic discharge.

19. The suppression circuit of claim 18, wherein said capacitor comprises a trench capacitor extending from an upper surface of said second well, through said second well and into said substrate.

20. The suppression circuit of claim 18, further comprising a plurality of trench capacitors, said capacitor comprising one trench capacitor of said plurality of trench capacitor, each trench capacitor of said plurality of trench capacitors extending from an upper surface of said second well, through said second well into said substrate.

21. A suppression circuit for dissipating an electrostatic discharge event at an input/output node of an integrated circuit, said suppression circuit comprising:

a discharge circuit electrically coupled to the input/output node for dissipating the electrostatic discharge event, said discharge circuit including a diode comprising a diffusion in a first well formed in a substrate, said diffusion being connected to said input/output node of the integrated circuit;

a capacitor coupling a second well to said substrate, and second well being electrically coupled to said first well such that said capacitor maintains said diode in a forward-biased mode during the electrostatic discharge event through a coupling of said first well to said substrate, thereby facilitating dissipating of the electrostatic discharge, wherein said capacitor comprises a trench capacitor extending from an upper surface of said second well, through said second well and into said substrate; and wherein said trench capacitor at least partially encircles said diffusion in said first well to function as a guard ring for said diffusion.

* * * * *

UNITED STATES PATENT AND TRADEMARK OFFICE
CERTIFICATE OF CORRECTION

PATENT NO. : 5,731,941
DATED : Mar. 24, 1998
INVENTOR(S) : Hargrove et al.

It is certified that error appears in the above-identified patent and that said Letters Patent are hereby corrected as shown below:

| | |
|---|---|
| Column 9, line 32, | "in,or,ace" should read --interface--. |
| Column 9, line 60, | "toppling" should read --coupling--. |
| Column 10, line 15, | "Dower" should read --power--. |
| Column 11, line 7, | "and" should read --said--. |

Signed and Sealed this

Eleventh Day of August 1998

Attest:

BRUCE LEHMAN

*Attesting Officer*     *Commissioner of Patents and Trademarks*